(12) United States Patent
Lin et al.

(10) Patent No.: US 11,146,216 B2
(45) Date of Patent: Oct. 12, 2021

(54) FILTER AND FILTERING METHOD

(71) Applicant: Realtek Semiconductor Corporation, Hsinchu (TW)

(72) Inventors: Wei-Chen Lin, Hsinchu (TW); Hsuan-Yi Su, Hsinchu (TW); Chih-Lung Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 52 days.

(21) Appl. No.: 16/787,239

(22) Filed: Feb. 11, 2020

(65) Prior Publication Data

US 2021/0050822 A1   Feb. 18, 2021

(30) Foreign Application Priority Data

Aug. 13, 2019 (TW) .................... 108128790

(51) Int. Cl.
| | |
|---|---|
| H03H 7/01 | (2006.01) |
| H03F 1/26 | (2006.01) |
| H03F 1/02 | (2006.01) |
| H03F 3/217 | (2006.01) |

(52) U.S. Cl.
CPC ............ *H03F 1/26* (2013.01); *H03F 1/0205* (2013.01); *H03F 3/217* (2013.01)

(58) Field of Classification Search
CPC .................... H03H 7/01; H03H 11/04

USPC .......................... 330/306; 333/167
See application file for complete search history.

(56) References Cited

U.S. PATENT DOCUMENTS

| | | | | |
|---|---|---|---|---|
| 5,055,843 A * | 10/1991 | Ferguson, Jr. | ........... | H03G 3/02 341/143 |
| 5,072,200 A * | 12/1991 | Ranky | ................. | H03H 11/1217 333/167 |
| 7,245,186 B2 * | 7/2007 | Chang | .................... | H03F 3/191 327/552 |
| 9,746,528 B2 * | 8/2017 | Chaintreuil | ........ | G01R 31/1272 |
| 2006/0044057 A1 | 3/2006 | Hezar et al. | | |

FOREIGN PATENT DOCUMENTS

| | | |
|---|---|---|
| CN | 205566245 U | 9/2016 |
| JP | 5781872 B2 | 9/2015 |

* cited by examiner

*Primary Examiner* — Henry Choe
(74) *Attorney, Agent, or Firm* — Locke Lord LLP; Tim Tingkang Xia, Esq.

(57) ABSTRACT

A filter includes M filter circuits. The M filter circuits are sequentially cascaded from an input terminal to an output terminal, in order to generate an output signal according to an input signal, in which M is a positive integer greater than or equal to 2. The M filter circuits include at least one first filter circuit and at least one second filter circuit. Each of the at least one first filter circuit is set to be an active filter circuit, and each of the at least one second filter circuit is set to be a passive filter circuit.

18 Claims, 3 Drawing Sheets

FILTER AND FILTERING METHOD

RELATED APPLICATIONS

This application claims priority to Taiwanese Application Serial Number 108128790, filed Aug. 13, 2019, which is herein incorporated by reference.

BACKGROUND

Technical Field

The present disclosure relates to a filter. More particularly, the present disclosure relates to a filter and a filtering method with low power consumption.

Description of Related Art

Filters have been widely applied in various data transmission interfaces and data transmission devices, in order to filter noise in signals for subsequent signal processing. With present technology, all circuits of a filter are implemented by active circuits. However, active circuits need an additional power or an additional clock signal. The overall power consumption of the filter increases. Thus, the present filter cannot be applied in applications with low power consumption.

SUMMARY

Some aspects of the present disclosure are to provide a filter which includes M filter circuits. The M filter circuits are sequentially cascaded from an input terminal to an output terminal, in order to generate an output signal according to an input signal, in which M is a positive integer greater than or equal to 2. The M filter circuits include at least one first filter circuit and at least one second filter circuit. Each of the at least one first filter circuit is set to be an active filter circuit, and each of the at least one second filter circuit is set to be a passive filter circuit.

Some aspects of the present disclosure are to provide a filtering method which includes the following steps: setting each of at least one first filter circuit of M filter circuits to be an active filter circuit; setting each of at least one second filter circuit of the M filter circuits to be a passive filter circuit; and generating an output signal according to an input signal by the M filter circuits. The M filter circuits are sequentially cascaded from an input terminal to an output terminal, and M is a positive integer greater than or equal to 2.

As described above, the filter and the filtering operation in some embodiments of the present disclosure are implemented by a mix of at least one active filter circuit and at least one passive filter circuit to eliminate noise. Thus, the filter can be applied in the applications with low power consumption.

DETAILED DESCRIPTION

Figure 1:
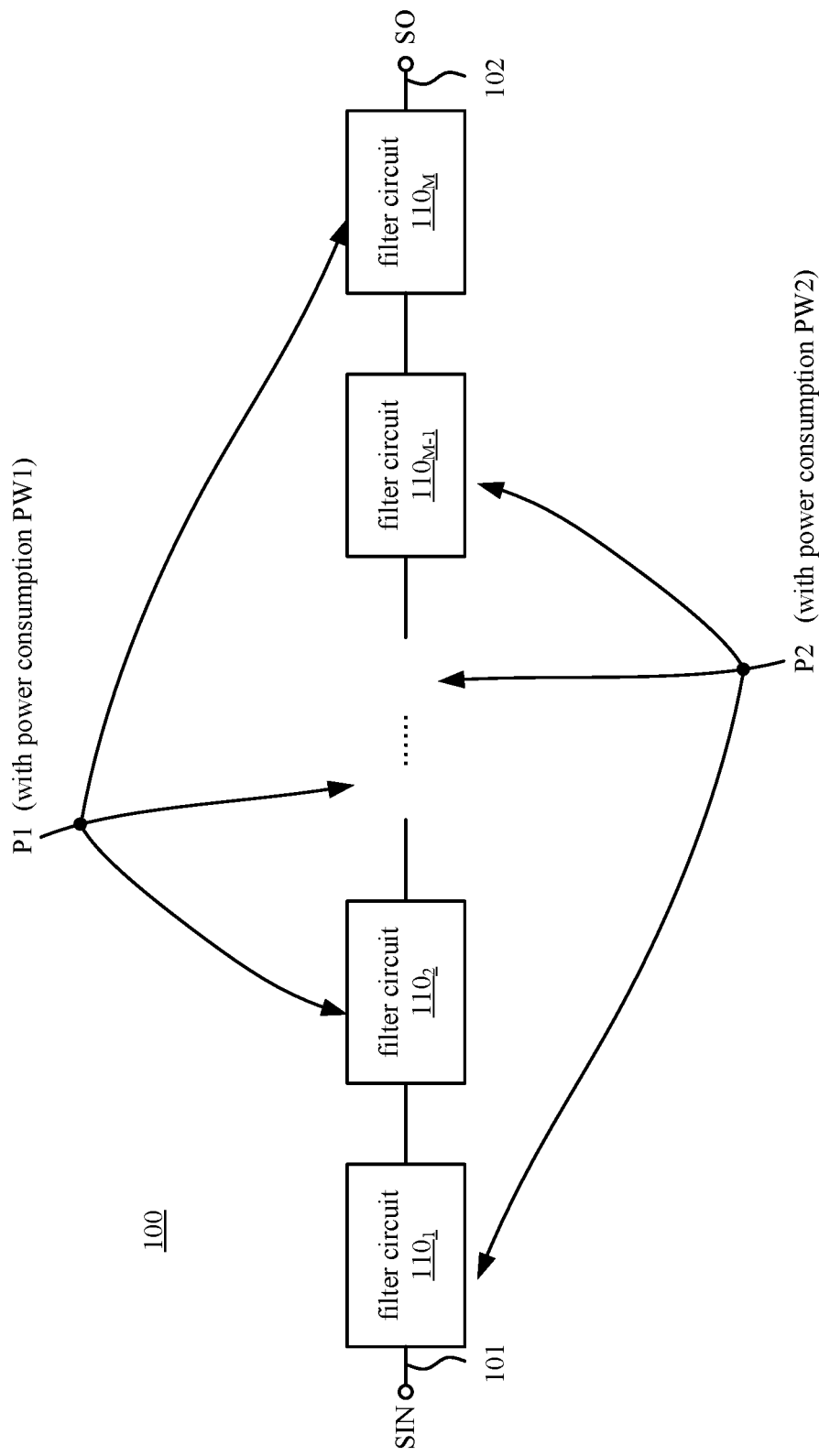
FIG. 1 is a schematic diagram of a filter according to some embodiments of the present disclosure.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in part of embodiments of the present embodiments. Furthermore, for simplifying the drawings, some of the conventional structures and elements are shown with schematic illustrations.

In the present disclosure, "connected" or "coupled" may refer to "electrically connected" or "electrically coupled." "Connected" or "coupled" may also refer to operations or actions between two or more elements.

In the present disclosure, the term "and/or" includes any and all combinations of one or more of the associated listed items.

It will be understood that, although the terms first, second, third etc. may be used in the present disclosure to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In the present disclosure, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In the present disclosure, "around", "about" or "approximately" shall generally mean within 20 percent, preferably within 10 percent, and more preferably within 5 percent of a given value or range. Numerical quantities given herein are approximate values, meaning that the term "around", "about" or "approximately" can be inferred if not expressly stated.

In this document, the term "circuitry" may indicate a system formed with one or more circuits. The term "circuit" may indicate an object, which is formed with one or more transistors and/or one or more active/passive elements based on a specific arrangement, for processing signals.

Various embodiments of the present technology are discussed in detail below with figures. It should be understood that the details should not limit the present disclosure. In other words, in some embodiments of the present disclosure, the details are not necessary. In addition, for simplification of figures, some known and commonly used structures and elements are illustrated simply in figures.

Reference is made to FIG. 1. FIG. 1 is a schematic diagram of a filter 100 according to some embodiments of the present disclosure. In some embodiments, the filter 100 may be applied in a transceiver to filter noise in signals. In some embodiments, the filter 100 may be suitable for WI-FI or Bluetooth technical fields.

In this example, the filter 100 includes multi-stage filter circuits $110_1$-$110_M$, in which M is a positive integer. The filter 100 includes an input terminal 101 and an output terminal 102. The input terminal 101 receives an input signal SIN, and the output terminal 102 outputs an output signal SO. The filter circuits $110_1$-$110_M$ are sequentially cascaded from the input terminal 101 to the output terminal 102, to provide a filtering response to process the input signal SIN, to generate the output signal SO. The filtering response allows signal components of the input signal SIN in a specific frequency band to pass, which shapes the input signal SIN to be the output signal SO. In different applications, the filtering response above may include a low-pass filtering, a high-pass filtering, a band-pass filtering, or a band-reject filtering.

In some embodiments, the input terminal 101 may be a single-ended input terminal. In some embodiments, the input terminal 101 may be a differential input terminal, and the input signal SIN is a difference between two differential input signals. In some embodiments, the output terminal 102 may be a single-ended output terminal. In some embodiments, the output terminal 102 may be a differential output terminal, and the output signal SO is a difference between two differential output signals.

In some embodiments, at least one filter circuit of the filter circuits $110_1$-$110_M$ is corresponding to a first part P1, and residual filter circuits of the filter circuits $110_1$-$110_M$ are corresponding to a second part P2. The at least one filter circuit of the first part P1 has power consumption PW1, and each of the filter circuits of the second part P2 has power consumption PW2. In some embodiments, the power consumption PW1 is greater than the power consumption PW2. For example, the power consumption PW1 is 4-5 times the power consumption PW2.

In some embodiments, each of the filter circuits $110_1$-$110_M$ may be implemented by an active filter circuit or a passive filter circuit. In some embodiments, the filter circuits $110_1$-$110_M$ includes filter circuits corresponding to the first part P1. Each of the filter circuits corresponding to the first part P1 is implemented by an active filter circuit. The filter circuits $110_1$-$110_M$ includes filter circuits corresponding to the second part P2. Each of the filter circuits corresponding to the second part P2 is implemented by a passive filter circuit.

For example, the filter circuits of the first part P1 may be any one of the filter circuits $110_1$-$110_M$, and the filter circuits of the first part P2 may be the rest of the filter circuits $110_1$-$110_M$. Alternatively, as embodiments of FIG. 2 described below, the filter circuits of the first part P1 may be the filter circuits $110_x$-$110_M$ (for example, the filter circuits closer to the output terminal 102), and the filter circuits of the second part P2 may be the filter circuits $110_1$-$110_{x-1}$ (for example, the filter circuits closer to the input terminal 101), in which x is a positive integer greater than 1 and less than or equal to M. If M is equal to 2, the filter circuits of the first part P1 is the last one stage (the second stage) filter circuit $110_M$, and the filter circuits of the second part P2 is the first stage filter circuit $110_1$.

In some embodiments, an active filter circuits is generally referred to a filter circuit having an amplify gain, and the circuit further can amplify signals in addition to filtering noise. For example, the active filter circuit may include amplify circuits, switched capacitor circuits and/or transconductance capacitors (gm-C), but the present disclosure is not limited thereto.

In some embodiments, a passive filter circuit is a circuit without an amplify gain. In some embodiments, the passive filter circuit is a circuit implemented by passive elements. For example, the passive filter circuit may include capacitor-resistor (RC) circuits, a resistor-inductor-capacitor ladder (RLC ladder) circuit, but the present disclosure is not limited thereto.

In some related approaches, current filter circuit structures are only implemented by active filter circuits with any passive circuit. However, the active filter circuits need power to operate. Thus, in these approaches, the power consumption of the filters is greater and not suitable for applications with low power consumption.

Compared with the approaches mentioned above, in some embodiments, the filter 100 is implemented by active filter circuits and passive filter circuits. Thus, power consumption of the filter 100 can be decreased significantly, which is more suitable for the applications with low power consumption.

Figure 2:
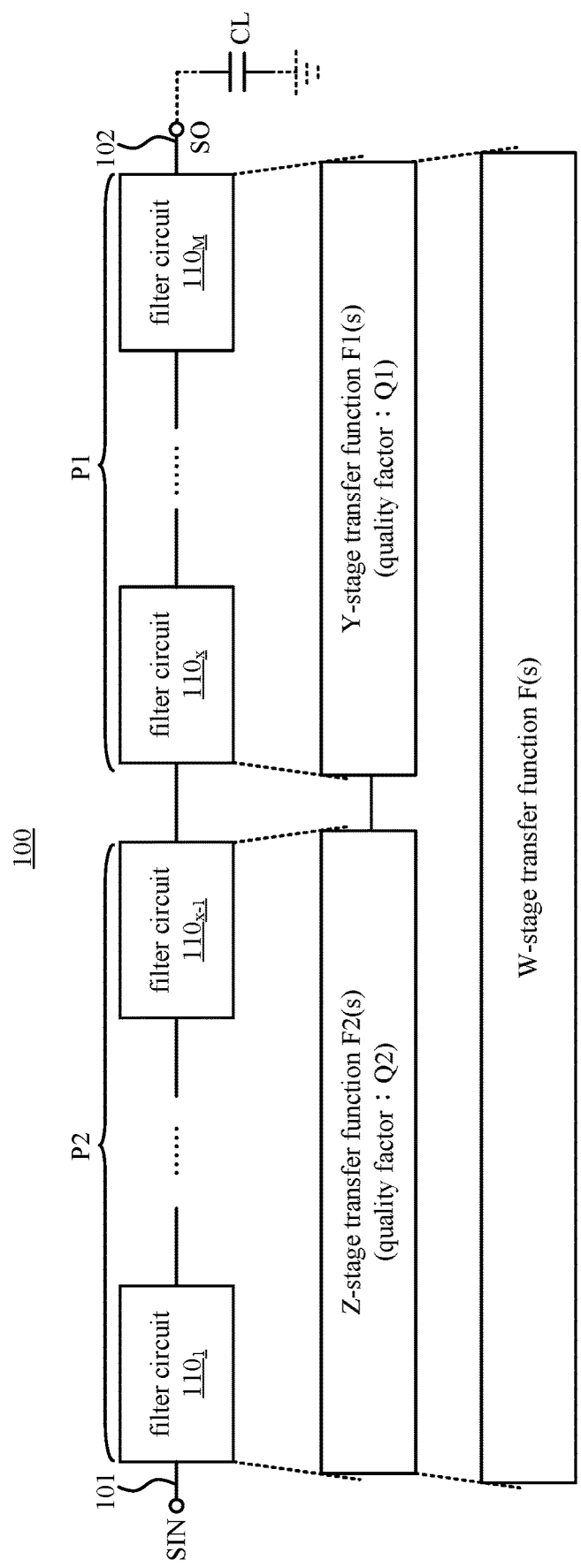
FIG. 2 is a schematic diagram of a filter according to some embodiments of the present disclosure.

Reference is made to FIG. 2. FIG. 2 is a schematic diagram of the filter 100 according to some embodiments of the present disclosure. Like elements in FIG. 1 and FIG. 2 are designated with the same reference numbers for ease of understanding.

In this example, the input terminal 101 is coupled to the output terminal 102 sequentially from the second part P2 to the first part P1. In some embodiments, the filter circuits $110_1$-$110_M$ form a W-stage transfer function F(s), in which W is a positive integer greater than or equal to 2. The transfer function F(s) is the aforementioned filtering response. If the stage number of the transfer function F(s) is greater, the decay amount in a stopband of the transfer function F(s) is more, and a noise eliminating ability of the filter 100 is better.

In some embodiments, the filter circuits $110_x$-$110_M$ of the first part P1 are corresponding to a Y-stage transfer function F1(s), and the filter circuits $110_1$-$110_{x-1}$ of the second part P2 are corresponding to a Z-stage transfer function F2(s). The stage number Y and the stage number Z are positive integers, and a sum of the stage number Y and the stage number Z is the stage number W. That is, W=Y+Z. In some embodiments, a product of the transfer function F1(s) and the transfer function F2(s) is the transfer function F(S). That is, F(S)=F1(s)×F2(s). The transfer function F1(s) is corresponding to a quality factor Q1 and the transfer function F2(s) is corresponding to a quality factor Q2.

In some embodiments, the quality factor Q1 is greater than the quality factor Q2. For example, the quality factor Q1 is substantially 2-3 times the quality factor Q2. In other words, the transfer function F(s) of the filter 100 may be implemented by the two transfer functions F1(s) and F2(s), in which the transfer function F1(s) corresponding to the greater quality factor Q1 may be implemented by the filter circuits $110_x$-$110_M$ of the first part P1, and the transfer function F2(s) corresponding to the smaller quality factor Q2 may be implemented by the filter circuits $110_1$-$110_{x-1}$ of the second part P2. In some embodiments, the quality factor Q1 is substantially greater than or equal to a predetermined value, and the quality factor Q2 is less than the predetermined value. In some embodiments, the predetermined value is substantially 0.707. In practice applications, a greater quality factor is easier to be implemented by the active filter circuits, to provide a band-pass response with peaking. Thus, in some embodiments, when a quality factor of a filter circuit is greater than or equal to the predetermined value, the filter circuit may be set to be an active filter circuit.

In some embodiments, a ratio of the stage number Y and the stage number W is substantially 60%, and a ratio of the stage number Z and the stage number W is substantially 40%. In some embodiments, a ratio of the stage number Y and the stage number W is substantially 50%, and a ratio of the stage number Z and the stage number W is substantially 50%. For example, the filter 100 has 4-stage (that is, the stage number W is 4) transfer function F(s) which has a low-pass response. Under this condition, the stage number Y of the transfer function F1(s) may be set to be 2, and the stage number Z of the transfer function F2(s) may be set to be 2. That is, the filter circuits $110_x$-$110_M$ are set to provide two-stage transfer function F1(s), and the filter circuits $110_1$-$110_{x-1}$ are set to provide two-stage transfer function F2(s).

The method above of setting the stage numbers above are for illustration, but the present disclosure is not limited thereto. Various methods for setting the stage numbers Y, Z, W are within the scope of the present disclosure.

As described above, each stage of the filter circuits of the second part P2 is implemented by passive filter circuits. If a load CL at the output terminal 102 is unknown, the transfer function F2(s) may be affected by the load CL behind the output terminal 102 and generate needless shifts. In this example, the second part P2 is set to be the filter circuits $1101$-$110_{x-1}$ closer to the input terminal 101, and is coupled to the output terminal 102 via the filter circuits $110_x$-$110_M$ of the first part P1. Since the first part P1 implemented by the active filter circuits has a driving ability which is enough to drive the load CL, the aforementioned problems can be avoided.

Alternatively, in some embodiments, under a condition that the load CL is known, circuit setting of the second part P2 and/or the transfer function F2(s) is adjusted in advance. Under this condition, the second part P2 may also be set to be the filter circuits $110_x$-$110_M$ closer to the output terminal 102, and the first part P1 may also be set to be the filter circuits $110_1$-$110_{x-1}$ closer to the input terminal 101. In some embodiments, a value of the load CL can be estimated and acquired using circuit simulations.

In addition, since the filter circuits of the second part P2 are implemented by the passive filter circuits, the input signal SIN may be decayed. For compensating the decay, a gain of at least one of the filter circuits $110_x$-$110_M$ of the first part P1 may be increased. For example, the gain of the last stage filter circuit $110_M$ closest to the output terminal 102 may be set to be the highest. That is, the gain of the last stage filter circuit $110_M$ is greater than a gain of each of the filter circuits $110_x$-$110_{M-1}$.

Figure 3:
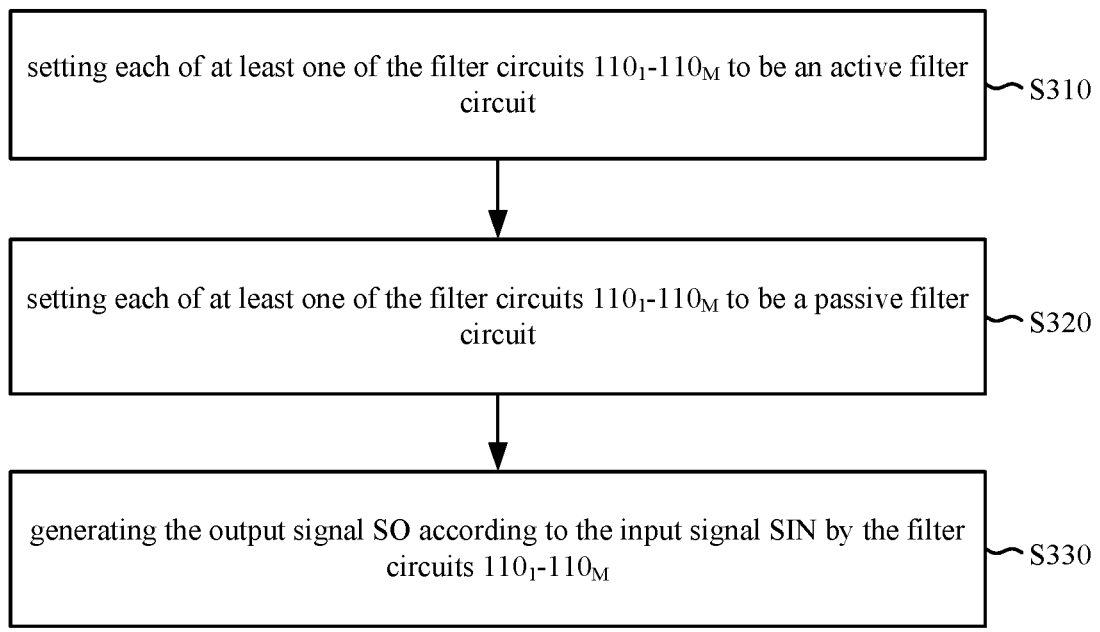
FIG. 3 is a flow diagram illustrating a filtering method according to some embodiments of the present disclosure.

Reference is made to FIG. 3. FIG. 3 is a flow diagram illustrating a filtering method 300 according to some embodiments of the present disclosure.

In operation S310, each of at least one of the filter circuits $110_1$-$110_M$ is set to be an active filter circuit. For example, as described above, each of the filter circuits of the first part P1 is set to be an active filter circuit.

In operation S320, each of at least one of the filter circuits $110_1$-$110_M$ is set to be a passive filter circuit. For example, as described above, each of the filter circuits of the second part P2 is set to be a passive filter circuit.

In operation S330, the filter circuits $110_1$-$110_M$ generates the output signal SO according to the input signal SIN.

The above description of the filtering method 300 includes exemplary operations, but the operations of the filtering method 300 are not necessarily performed in the order described. The order of the operations of the filtering method 300 disclosed in the present disclosure are able to be changed, to be added, to be replaced, or to be omitted, or the operations are able to be executed simultaneously or partially simultaneously as appropriate, in accordance with the spirit and scope of various embodiments of the present disclosure.

As described above, the filter and the filtering operation in some embodiments of the present disclosure are implemented by a mix of at least one active filter circuit and at least one passive filter circuit to eliminate noise. Thus, the filter and the filtering operation can be applied in the applications with low power consumption.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A filter, comprising:
M filter circuits comprising a first stage filter circuit to an $(M)_{th}$ stage filter circuit sequentially cascaded from an input terminal to an output terminal, in order to generate an output signal according to an input signal, wherein M is a positive integer greater than 2, wherein the M filter circuits comprise:
at least one first filter circuit comprising the $(M)_{th}$ stage filter circuit and an $(M-1)_{th}$ stage filter circuit set to be active filter circuits, wherein the $(M)_{th}$ stage filter circuit is closest to the output terminal, and a gain of the $(M)_{th}$ stage filter circuit is greater than a gain of the $(M-1)_{th}$ stage filter circuit; and
at least one second filter circuit, wherein each of the at least one second filter circuit is set to be a passive filter circuit.

2. The filter of claim 1, wherein the at least one first filter circuit has first power consumption, the at least one second filter circuit has second power consumption, and the first power consumption is greater than the second power consumption.

3. The filter of claim 1, wherein the at least one first filter circuit comprises an $(x)_{th}$ stage filter circuit to the $(M)_{th}$ stage filter circuit near the output terminal, and x is a positive integer greater than 1 and less than or equal to (M−1).

4. The filter of claim 1, wherein the at least one second filter circuit comprises the first stage filter circuit to an $(x-1)_{th}$ stage filter circuit near the input terminal, and x is a positive integer greater than 1 and less than or equal to (M−1).

5. The filter of claim 1, wherein the M filter circuits have a W-stage transfer function, the at least one first filter circuit has a Y-stage transfer function, the at least one second filter circuit has a Z-stage transfer function, W is a product of Y and Z, and W, Y, and Z are positive integers.

6. The filter of claim 5, wherein W is 4, and Y and Z are 2.

7. The filter of claim 5, wherein a ratio of Y and W is 50%, and a ratio of Z and W is 50%.

8. The filter of claim 1, wherein the at least one first filter circuit has a first quality factor, the at least one second filter circuit has a second quality factor, and the first quality factor is greater than the second quality factor.

9. The filter of claim 1, wherein the input terminal is coupled to the output terminal via the at least one second filter circuit and the at least one first filter circuit sequentially.

10. A filtering method, comprising:
setting each of at least one first filter circuit of M filter circuits to be an active filter circuit, wherein the M filter circuits comprise a first stage filter circuit to an $(M)_{th}$ stage filter circuit sequentially cascaded, wherein the at least one first filter circuit comprises the $(M)_{th}$ stage filter circuit and an $(M-1)_{th}$ stage filter circuit, wherein the $(M)_{th}$ stage filter circuit is closest to an output terminal, and a gain of the $(M)_{th}$ stage filter circuit is greater than a gain of the $(M-1)_{th}$ stage filter circuit;

setting each of at least one second filter circuit of the M filter circuits to be a passive filter circuit; and generating an output signal according to an input signal by the M filter circuits, wherein the M filter circuits are sequentially cascaded from an input terminal to the output terminal, and M is a positive integer greater than 2.

11. The filtering method of claim 10, wherein the at least one first filter circuit has first power consumption, the at least one second filter circuit has second power consumption, and the first power consumption is greater than the second power consumption.

12. The filtering method of claim 10, wherein the at least one first filter circuit comprises an $(x)_{th}$ stage filter circuit to the $(M)_{th}$ stage filter circuit near the output terminal, and x is a positive integer greater than 1 and less than or equal to (M−1).

13. The filtering method of claim 10, wherein the at least one second filter circuit comprises the first stage filter circuit to an $(x-1)_{th}$ stage filter circuit near the input terminal, and x is a positive integer greater than 1 and less than or equal to (M−1).

14. The filtering method of claim 10, wherein the M filter circuits have a W-stage transfer function, the at least one first filter circuit has a Y-stage transfer function, the at least one second filter circuit has a Z-stage transfer function, W is a product of Y and Z, and W, Y, and Z are positive integers.

15. The filtering method of claim 14, wherein W is 4, and Y and Z are 2.

16. The filtering method of claim 14, wherein a ratio of Y and W is 50%, and a ratio of Z and W is 50%.

17. The filtering method of claim 10, wherein the at least one first filter circuit has a first quality factor, the at least one second filter circuit has a second quality factor, and the first quality factor is greater than the second quality factor.

18. The filtering method of claim 10, wherein the input terminal is coupled to the output terminal via the at least one second filter circuit and the at least one first filter circuit sequentially.

* * * * *